(12) United States Patent
Mikhaylichenko et al.

(10) Patent No.: US 6,521,050 B1
(45) Date of Patent: Feb. 18, 2003

(54) METHODS FOR EVALUATING ADVANCED WAFER DRYING TECHNIQUES

(75) Inventors: Katrina Mikhaylichenko, San Jose, CA (US); Vladislav Yakovlev, Milwaukee, WI (US); Mike Ravkin, Sunnyvale, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 33 days.

(21) Appl. No.: 09/752,609

(22) Filed: Dec. 27, 2000

(51) Int. Cl.[7] .................................................. B08B 7/04
(52) U.S. Cl. ........................ 134/18; 134/2; 134/13; 134/25.1; 134/26; 134/34; 250/459.1; 250/458.1; 252/301.19
(58) Field of Search ........................... 134/2, 13, 18, 134/25.1, 26, 34; 250/459.1, 458.1; 252/301.19

(56) References Cited

U.S. PATENT DOCUMENTS

| 4,558,012 A | * | 12/1985 | Nygren et al. ................. 422/57 |
| 5,518,656 A | * | 5/1996 | Furuta et al. ........... 252/301.19 |
| 6,108,093 A | * | 8/2000 | Berman ....................... 356/394 |
| 6,335,531 B1 | * | 1/2002 | Somerville et al. ...... 250/458.1 |

* cited by examiner

*Primary Examiner*—Randy Gulakowski
*Assistant Examiner*—Gentle Winter
(74) *Attorney, Agent, or Firm*—Martine & Penilla, LLP

(57) ABSTRACT

Methods for evaluating advanced wafer drying techniques are provided. An exemplary method includes applying a solution containing an analytically detectable compound to a substrate prior to a desired drying operation. The method then provides for the inspection and analysis of the substrate for any residue of the analytically detectable compound, the presence of which identifies any regions of the substrate where the drying operation is ineffective. The drying operation is selected, changed, or modified according to the results of the evaluation.

25 Claims, 5 Drawing Sheets

METHODS FOR EVALUATING ADVANCED WAFER DRYING TECHNIQUES

CROSS REFERENCE TO RELATED APPLICATION

This application is related to U.S. patent application Ser. No. 09/752,697, filed on the same date as the instant application, and entitled "SYSTEM AND APPARATUS FOR EVALUATING THE EFFECTIVENESS OF WAFER DRYING OPERATIONS." This cross referenced application is hereby incorporated by reference.

BACKGROUND OF THE INVENTION

1. Field of the Invention

The present invention relates generally to wet cleaning of substrates during semiconductor wafer fabrication, and more particularly, to techniques for evaluating the effectiveness of techniques and apparatus used to dry substrates following a wet clean procedure.

2. Description of the Related Art

In the fabrication of semiconductor devices, there is a need to perform wet cleaning of substrates at various stages of the fabrication process. Typically, integrated circuit devices are in the form of multi-level structures. At the substrate level, transistor devices having diffusion regions are formed over and into silicon substrates. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In some applications, metallization line patterns are formed in the dielectric material, and then metal CMP operations are performed to remove excess metallization.

Following each CMP operation, a wet clean of the substrate is performed. The wet clean is designed to wash away any by-products of the fabrication process, remove contaminants, and to achieve and maintain the necessary degree of cleanliness essential to proceed to a subsequent fabrication operation. As transistor device structures become smaller and more complex, the precision required to achieve and maintain structure definition demands exacting standards of cleanliness be maintained in all process operations. If a wet clean is incomplete or ineffective, or if a post-wet clean drying is incomplete or ineffective, then unacceptable residue or contaminants are introduced into the processing environment.

Rinsing and drying techniques, methods, and apparatus are plentiful and known in the art, and incorporate such operations as rinsing and scrubbing, immersion, and the application of thermal, mechanical, chemical, electrical, or sonic energy and the like to remove or displace water and dry the substrate. While some scrub and rinse operations may employ acids or bases for vigorous interaction with fabrication byproducts, deionized water (DIW) is commonly used to perform a final rinse before the desired drying technique is performed.

One common drying technique is known as spin, rinse and dry (SRD). SRD uses mechanical, centrifugal, energy to rid the substrate of water by spinning the substrate until dry.

FIG. 1 shows a typical prior art SRD process and apparatus 10. An SRD apparatus 10 typically includes a substrate mounting plate 18 within a bowl 12 and mounted on a shaft 20 that is configured to rotate and thus spin the substrate 14. The substrate 14 is attached to the substrate mounting plate 18 with mounting pins 16 configured to maintain the substrate 14 in a horizontal orientation, firmly affixed to the substrate mounting plate 18 so that rapid rotation of the substrate mounting plate 18 spins the substrate 14 and forces the water from the substrate 18. DIW 26 is typically dispensed from a nozzle 24 which is positioned over the substrate 14 and connected to a DIW supply 22.

The SRD process essentially includes applying DIW or rinsing 28, and spinning the substrate dry 30. In some configurations, the substrate 14 is rinsed 28 while spinning to ensure thorough rinsing 28, and then spun to dry 30. The spinning of the substrate 14 uses centrifugal energy to force water from the substrate 14 surface, and can be enhanced with the introduction of an inert gas such as Nitrogen or an inert gas vapor to displace any water that is not completely removed by spinning. Additional variations include heating the DIW, heating the SRD environment, heating the inert gas, and the like.

Another common drying technique is known as a Marangoni technique. Marangoni drying (not shown) typically includes using a chemical drying fluid or solvent such as isopropyl alcohol (IPA) to introduce favorable surface tension gradients facilitating removal of water from the surface of a wafer. Variations of the Marangoni technique also include the introduction of an inert gas such as Nitrogen as a carrier gas for IPA vapor delivery.

Additionally, another known drying technique involves the replacement of DIW with another volatile compound.

Whichever method or combination of methods is employed to dry a substrate, effective drying is essential to continued fabrication. As is known, contaminates can damage or destroy features that are formed in single dies, groups of dies, or entire wafers.

Any water remaining of the surface of a substrate after the drying process evaporates. Water allowed to evaporate introduces contaminants as evidenced by the water marks or stains caused by residual solids from evaporated water. It is therefore desirable to evaluate drying techniques used, recognizing that the techniques are more or less effective depending on such factors as the type of substrate being processed, fabrication materials, processing environment, and the like. Common methods of evaluating the effectiveness of selected drying techniques include visual inspection, electrical analysis and mass analysis.

Visual inspection of substrates is generally effective for blanket film substrates as the surface of the substrate is smooth and easily inspected for remaining water marks. Patterned substrates, however, are difficult to inspect visually as water can be trapped in patterned features and not visible. Visual inspection is therefore ineffective for drying technique evaluation of patterned substrates.

Electrical analysis can be effective for specially prepared test structures after subjecting such structures to an electrical test such a TVS and the like. Such electrical analysis, however, is costly.

Mass analysis is a comparative evaluation of wet and dry substrates. Typically, mass analysis includes an initial drying operation followed by weighing the substrate and then, after some time, re-weighing the substrate to determine if a change in mass has or has not occurred. Although mass analysis is not subject to the same limitations presented by visual inspection and electrical analysis in the evaluation of patterned substrates, mass analysis is cumbersome, time consuming, and far less accurate than other methods.

What is needed is a method to evaluate advanced drying techniques used in the fabrication of semiconductor substrates. The method should include a way to accurately and precisely analyze a substrate that has been dried for any trace amount of residual contamination, and to use the results of the analysis to select, modify, or adjust the drying technique to ensure complete substrate drying in a contaminate-free environment.

SUMMARY OF THE INVENTION

Broadly speaking, the present invention fills these needs by providing a method for evaluating drying techniques. The method of evaluation includes applying a compound to a final rinse following a wet clean of a substrate, drying the wafer in accordance with the selected drying technique, and then analyzing any residual compound on the substrate after the drying method is completed. The present invention can be implemented in numerous ways, including as a process, an apparatus, a system, a device, or a method. Exemplary embodiments of the present invention are described below.

In accordance with one aspect of the invention, a method for analyzing the effectiveness of a substrate drying operation is provided. The method includes applying a fluid solution that contains an analytically detectable compound to a surface of a substrate. The surface of the substrate has features defined therein. The method further includes spinning the substrate so that the fluid solution dries. When the fluid solution dries, it leaves a residue of the analytically detectable compound on and around the features in areas where the spinning of the substrate failed to completely remove the solution from the surface of the substrate during the spinning. The method then includes inspecting the substrate to identify any of the residue. Any residue that is identified defines those areas where the substrate drying operation failed to adequately remove the solution from the surface of the substrate.

In accordance with another aspect of the invention, a method for analyzing the effectiveness of a wafer drying operation is provided. The method includes applying a fluid solution that includes an analytically detectable compound to a surface of a wafer. The surface of the wafer has features defined therein, and the features define portions of semiconductor devices. The method next provides for spinning the wafer so that the fluid solution dries. The drying of the fluid solution is configured to leave a residue of the analytically detectable compound on and around the features in areas where the spinning of the wafer failed to completely remove the solution from the surface of the wafer during the spinning. The method further provides for optically inspecting the wafer. The optical inspection is designed to identify any of the residue which defines those areas where the wafer drying operation failed to adequately remove the solution from the surface of the wafer.

In accordance with yet another aspect, the present invention provides a method for evaluating substrate drying techniques. The method includes providing a substrate and applying an analytically detectable compound in solution to a first surface of the substrate. The method then provides for drying the substrate with the analytically detectable compound in solution on the first surface of the substrate, and then analyzing the first surface of the substrate to detect any residue of the analytically detectable compound remaining on the substrate.

In yet another embodiment, a method for rating the effectiveness of a wafer drying operation, is provided. The method includes applying a fluid solution including an analytically detectable compound to a surface of a wafer. The surface of the wafer has features defined therein, and the features define portions of semiconductor devices. The method next includes spinning the wafer so that the fluid solution dries. The drying of the fluid solution is configured to leave a residue of the analytically detectable compound on and around the features in areas where the spinning of the wafer failed to completely remove the solution from the surface of the wafer during the spinning. Next, the method provides for inspecting the wafer. The wafer inspection is designed to identify any of the residue. The identified residue defines those areas where the wafer drying operation failed to adequately remove the solution from the surface of the wafer. The method further includes modifying the wafer drying operation to improve drying, and repeating the method until an optimum drying performance is obtained for a specific wafer having predetermined geometric feature distributions.

In yet a further embodiment, a method for determining the effectiveness of a wafer drying operation is provided. The method provides for applying a fluid solution which includes an analytically detectable compound to a surface of a wafer that has features which define portions of semiconductor devices. The method then includes spinning the wafer so that the fluid solution dries. The drying of the fluid solution is configured to leave a residue of the analytically detectable compound on and around the features in areas where the spinning of the wafer failed to completely remove the solution from the surface of the wafer during the spinning. Next, the method provides for inspecting the wafer to identify any of the residue. Any identified residue defines those areas where the wafer drying operation failed to adequately remove the solution from the surface of the wafer. The wafer drying operation is then modified to improve drying and the method is repeated until an optimum drying performance is obtained for a specific wafer having predetermined geometric feature distributions. The method then implements the optimum drying performance in production wafer drying.

The advantages of the present invention are numerous. One notable benefit and advantage of the invention is the methods allow for non-biased, quantitative comparison of different drying techniques on patterned wafers. The most commonly utilized prior art provides no quantitative evaluation, and suffers significant shortcomings as previously detailed. The present invention can be implemented for a plurality of drying techniques, and provides usable, measurable data to evaluate the effectiveness of the selected technique for specific structures, geometries, complexities, and the like.

Another benefit is the cost effectiveness of the present invention. The methods do not require implementation with production, device wafers, but can be used in the R&D stage of production, and with test pattern wafers. This further allows effective evaluation of drying technologies at the stage of concept and feasibility studies, and thus reduces the associated cost of new cleaning tool development.

An additional benefit is that the present invention is an efficient and simple concept. Implementation is easily and efficiently incorporated into existing infrastructure, and vastly increases the efficiency of development and production.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF EXEMPLARY EMBODIMENTS

An invention for a method to evaluate the effectiveness of drying techniques used following a substrate wet clean during semiconductor wafer fabrication is disclosed. In preferred embodiments, the method includes introducing a solution of deionized water and an analytically detectable compound on to the surface of the substrate, drying the substrate, and then determining the presence of a residue of the analytically detectable compound on the surface of the substrate. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
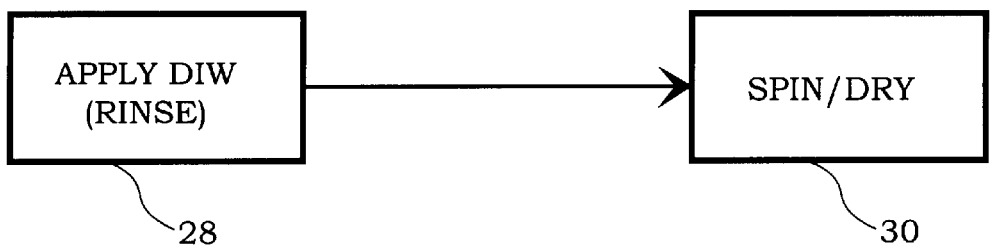
FIG. 1 shows a typical prior art SRD process and apparatus.
Figure 1:
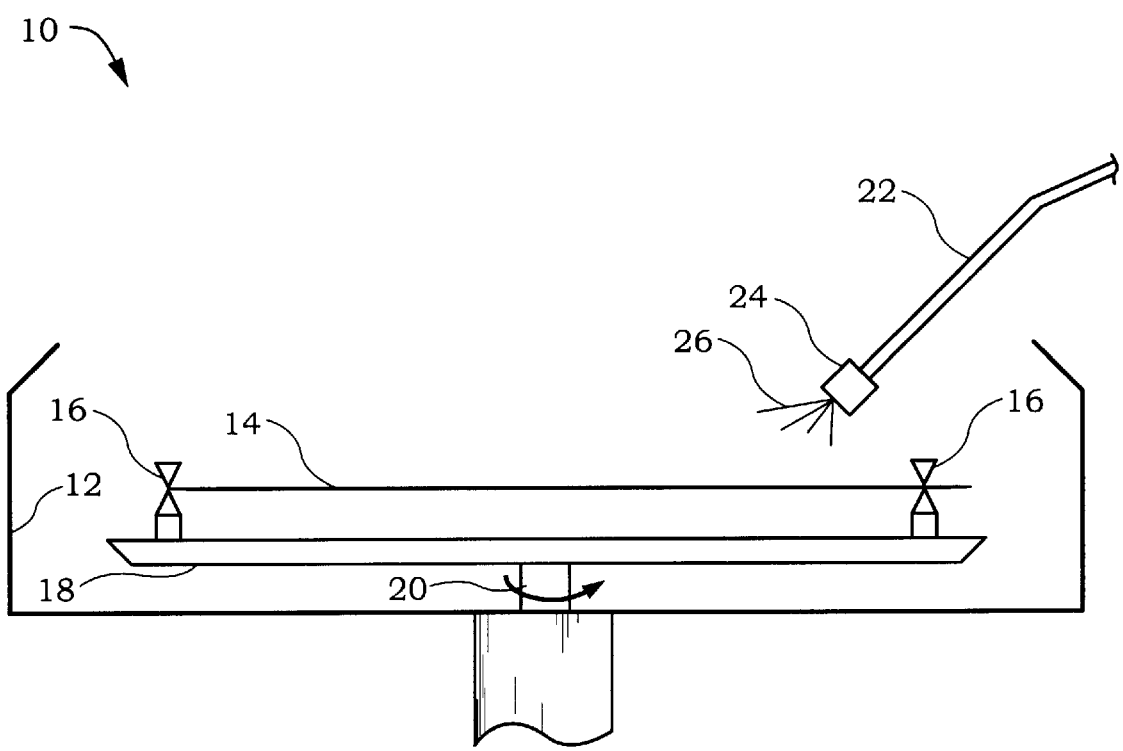
Figure 2A:
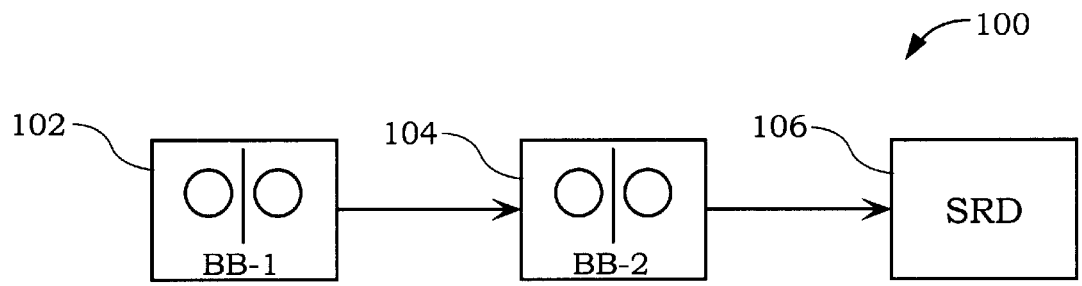
FIG. 2A shows a process flow diagram for a typical wet clean procedure in accordance with one embodiment of the present invention.

FIG. 2A shows a process flow diagram 100 for a typical wet clean procedure in accordance with one embodiment of the present invention. A substrate to be processed through a wet clean is processed through brush box 1 (BB-1) 102, followed by brush box 2 (BB-2) 104, and then rinsed and dried in a spin-rinse-dry (SRD) apparatus 106. In some cases, only one brush box need be used. One alternative to the SRD 106 drying operation is a Marangoni drying technique which is known in the field of semiconductor wafer fabrication. Another alternative to the SRD 106 drying operation is an HFE dryer, which is also a known technique and apparatus. The process flow diagram 100 is configured to clean any by-products of fabrication processes, remove any contamination from the wafer, and dry the wafer in preparation for subsequent fabrication operations. One embodiment of the present invention is incorporated into the SRD 106 apparatus and process, as described below in reference to FIG. 2B.

Figure 2B:
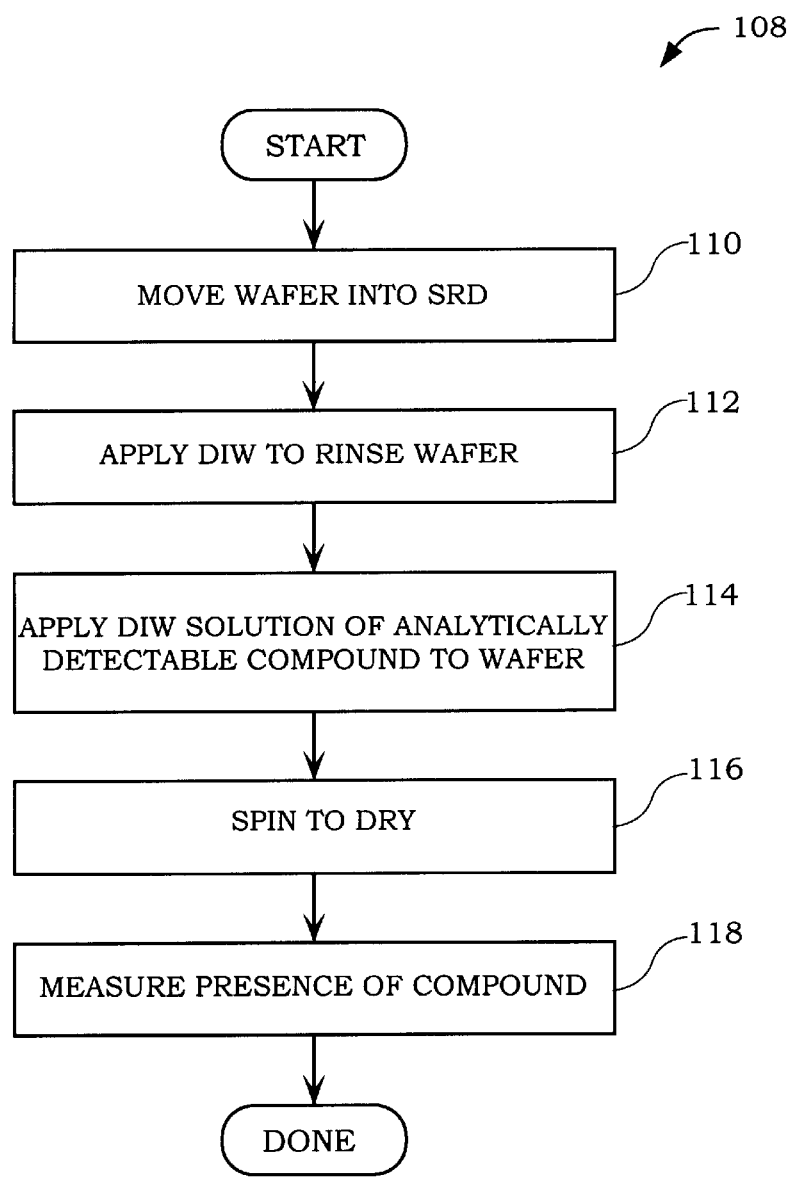
FIG. 2B is a high-level flow chart illustrating the method operations of evaluating drying techniques in accordance with an embodiment of the present invention.

FIG. 2B is a high-level flow chart 108 illustrating the method operations for evaluating drying techniques in accordance with an embodiment of the present invention. The method operations identified in the high-level flow chart 108 are general, broad category method operations that are developed in greater detail in reference to FIGS. 3A–4C. As described above in reference to FIG. 2A, the method begins at operation 110 in which a wafer is moved into an SRD. Typically, the wafer has been processed through a wet clean, including the operations of scrubbing in a first brush box and a second brush box. In one embodiment, the wet clean process includes a scrubbing of the wafer with, deionized water (DIW), ammonium hydroxide, an hydrofluoric acid or some other chemical in BB-1 102 (FIG. 2A), and then a rinsing and scrubbing of the wafer with deionized water in BB-2 104 (FIG. 2A). As the wafer is processed through the wet clean, the wafer is moved into the SRD as identified in operation 110.

The method advances to operation 112 in which DIW is applied to rinse the wafer. Operation 112 represents a typical "final" rinse of a wet clean procedure once the wafer has been inserted into the SRD.

In operation 114, an analytically detectable compound in a solution with DIW is applied to the wafer. As will be described in greater detail below, the compound, in a preferred embodiment, is truly soluble in water. The solution of DIW and the compound is applied over the entire surface of the wafer. Variables such as flow rate, concentration of the compound, and duration of application are discussed in greater detail below.

Once the compound in solution has been applied to the wafer in operation 114, the method advances to operation 116 in which the wafer is spun dry in accordance with known techniques for utilizing an SRD to dry a wafer. In an alternative embodiment, the wafer drying technique is a Marangoni method, and in operation 116 the water would be removed using the assistance of applied isopropyl alcohol (IPA), or immersed or otherwise bathed in IPA or other drying fluid in order to accomplish the drying of the wafer.

The method concludes with operation 118 in which the presence of the compound, or compound residue, is measured on the dried wafer. As will be described in greater detail below, the dried wafer is inspected and analyzed to detect the presence of the compound, and thus the selected drying technique is evaluated or rated for effectiveness, and modified accordingly.

In one embodiment of the present invention, the compound is selected in accordance with the analytical technique employed to inspect and analyze the substrate. The compound should be truly soluble in water, non-volatile, and easily detectable by the analytical technique selected. By way of example, analytical techniques might include spectroscopic or fluorescent detection and analysis, and the like. The compound in such an embodiment might be a laser dye such as Rhodamine 590, which is easily detectable in solution and as a residue after any liquid has evaporated. Other exemplary laser dyes may include Rhodamine 610, Kiton Red 620, Rhodamine 640, Coumarin 450, Coumarin 480, Coumarin 487, LD 489, Coumarin 500, and other such dyes. Other examples of dyes or other compounds include any organic or inorganic material producing fluorescence under external excitation.

Therefore, after the selected compound in solution has been applied, and the wafer has been dried in accordance with the selected drying method or technique, if any solution remains on the surface of the substrate or in the patterned features, the remaining solution would evaporate, but a solid residue of the selected compound would remain and would be detectable spectroscopically, fluorescently, with laser scattering, or in a similar analytical detection manner.

Figure 3A:
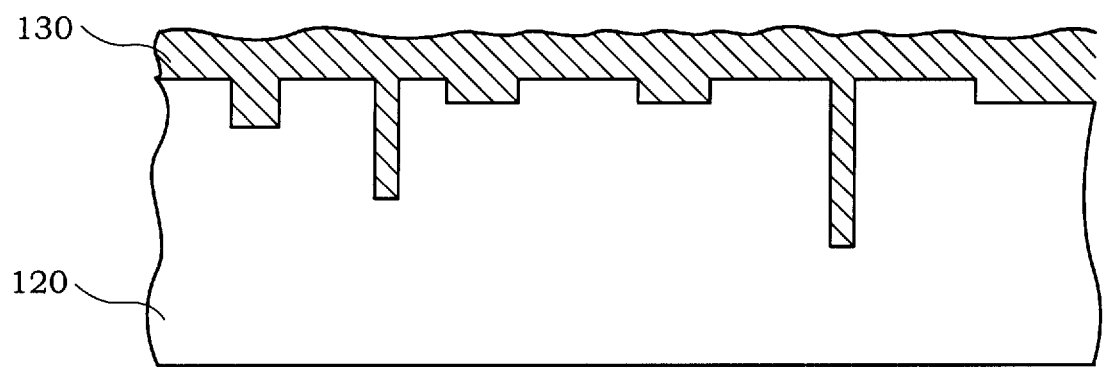
FIG. 3A shows a cross section of a patterned wafer in accordance with one embodiment of the invention.

One embodiment of the present invention provides an optimal method of evaluating the drying technique selected for drying a patterned wafer. The intricate features present in a patterned wafer provide the space and opportunity for water to be trapped during a wet clean, and further, to obscure the trapped water and residue (e.g., once the water has evaporated) from common visual inspection techniques. FIG. 3A shows a cross section of a patterned wafer 120 in accordance with one embodiment of the invention. A compound in solution 130 is applied to the surface of the wafer 120. The surface of the wafer 120 includes a varied topography resulting from the representative features being fabricated. FIG. 3A shows representative features including, for example, shallow trenches, deep trenches, broad trenches, and very narrow trenches. While not all-inclusive of the plurality of features resulting during the fabrication of semiconductor devices, the features shown in FIG. 3A illustrate a surface capable of trapping water within the patterned structures.

The compound in solution 130 is applied to completely cover the surface and fill the features of the patterned wafer 120. Because the compound must be completely distributed over the surface of the wafer where the DIW is and is capable of being distributed, the compound must be truly soluble in water. An alternative embodiment discussed in greater detail below contains particles in suspension, but in the embodiment illustrated in FIG. 3A, the compound is in solution. Any surface covered with DIW is therefore covered with the solution as illustrated in FIG. 3A.

In order to ensure complete coverage of the wafer 120 with the compound in solution 130, at least three variables of the compound in solution 130 are monitored and adjusted as necessary: flow rate, duration of application, and concentration of compound in solution. The flow rate of the compound in solution 130 when it is applied to the wafer 120 is anticipated to range from about 100 ml/min.–1000 ml/min., with a preferred flow rate of about 400 ml/min. Such factors as the size of the wafer, the size and type of patterned features, the rate of rotation of the wafer (in an SRD embodiment), process conditions such as process environment temperature, pressure, and solution viscosity, and the like are considered in determining an optimum flow rate for a specific application. Accordingly, the flow rate ranges will vary depending upon the particular environment parameters.

The duration of the application of the compound in solution 130 to the surface of the wafer 120 (e.g., the length of time the solution is on the surface of the wafer before the drying process is commenced) is anticipated to range between about 1 second and about 5 minutes for most acceptable solutions, between about 10 seconds and about 1 minute for a preferred embodiment using a laser dye solution, with a typical duration of about 20 seconds. The duration of application varies with the above-listed factors, and more particularly with the specific compound in solution selected.

The concentration of the selected solution also varies in accordance with the above listed factors, with a primary consideration being the detection method selected. In a preferred embodiment of the invention, the detection method is a laser spectroscopy, and the compound selected would be a form of laser dye. It is anticipated that the concentration of the selected compound in DIW will range from about $10^{-6}$ grams/liter to about $10^{-2}$ grams/liter, with a preferred concentration of about $10^{-3}$ grams/liter. The concentration, however, may vary significantly with the different types of analytically detectable compounds, and must be optimized accordingly. Other types of analytically detectable compounds include $NaHSO_4$, $CS_2$, Benzene detectable by Raman spectroscopy, CdS, CdSe detectable with luminescence, and the like.

Figure 3B:
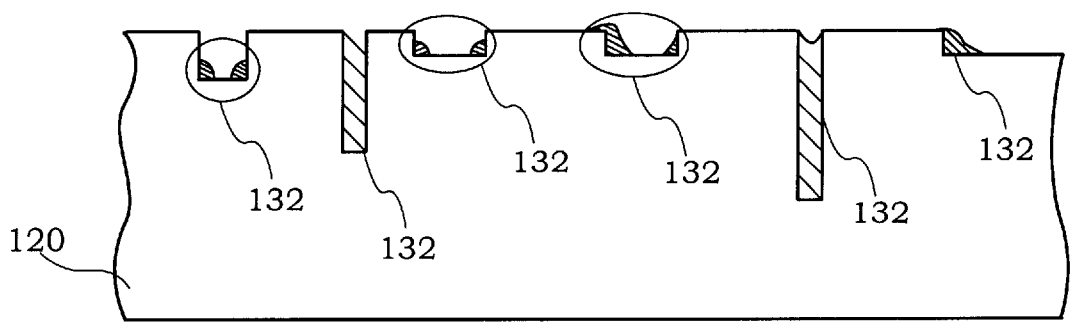
FIG. 3B shows the wafer of FIG. 3A immediately after the drying process in accordance with one embodiment of the invention.

FIG. 3B shows the wafer 120 of FIG. 3A immediately after the drying process in accordance with one embodiment of the invention. By way of example, the drying process may have been an SRD. Some of the compound and DIW in solution 132 remains trapped on the surface of the wafer 120 and inside the patterned features. The amount of remaining compound and DIW in solution 132 has been exaggerated in FIG. 3B to illustrate the various regions in pattern features where the solution 132 can commonly remain trapped. The SRD drying technique involves a mechanical drying process of spinning the wafer as described above, and as illustrated in the embodiment shown in FIG. 3B, the mechanical process alone may not be effective in completely removing the solution from the surface, or drying the surface of a patterned substrate with complex pattern features. In more complex patterns, mechanical spinning may not be effective in thoroughly removing water from the corners or in deep or narrow trenches of the pattern.

Figure 3C:
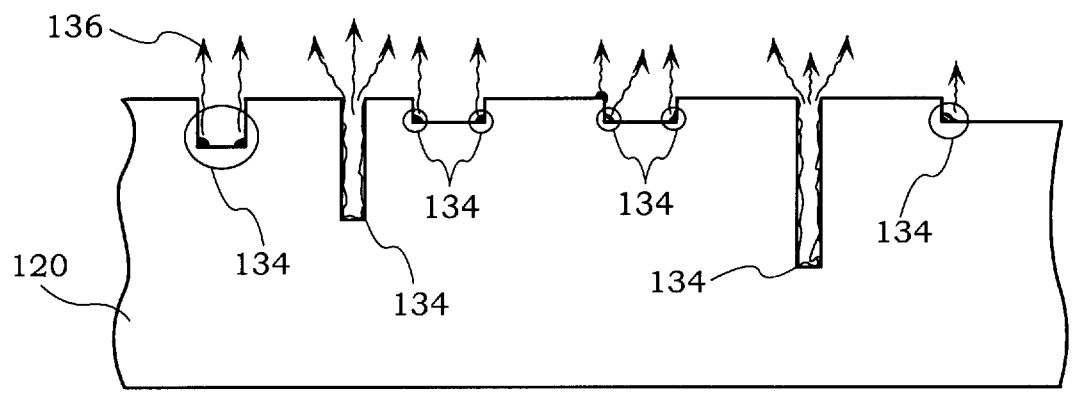
FIG. 3C shows the wafer of FIGS. 3A and 3B after the wafer has been allowed to stand and any remaining solution has evaporated in accordance with one embodiment of the invention.

FIG. 3C shows the wafer 120 of FIGS. 3A and 3B after the wafer has been allowed to stand and any remaining solution 132 (FIG. 3B) has evaporated in accordance with one embodiment of the invention. A solid residue of the compound 134 remains in those features where the remaining solution 132 was trapped. The compound, and its residue 134, is analytically detectable. In FIG. 3C, a signal 136 is shown emanating from the residue 134. In one embodiment, the strength of the signal 136 is directly proportional to the amount of compound residue 134 remaining on the wafer 120 and in the pattern features. The wafer 120 is analyzed to detect any presence of the signal 136, and evaluated to determine the effectiveness of the selected drying technique. The signal 136 might be a fluorescent radiation from the solid residue of a laser dye that can be easily detected, measured, evaluated, and mapped to provide a comprehensive evaluation of the selected drying technique.

In one embodiment of the present invention, the analysis of the wafer is not a comprehensive analysis of each and every square micron of the wafer surface, but a scan of the wafer surface, and a detailed analysis of selected, representative regions of the wafer. As is known, a semiconductor wafer is typically fabricated as a plurality of dies. Each die includes a plurality of specific, semiconductor structures. Each specific semiconductor structure contains a plurality of specific patterned features. In the present invention, a few dies are selected for analysis as representative of a plurality of regions of a semiconductor wafer surface. By way of example, a die from near a center region of the wafer, one from near a mid-radius region of the wafer, and a die from near an edge of the wafer might be identified for comprehensive analysis.

Figure 4A:
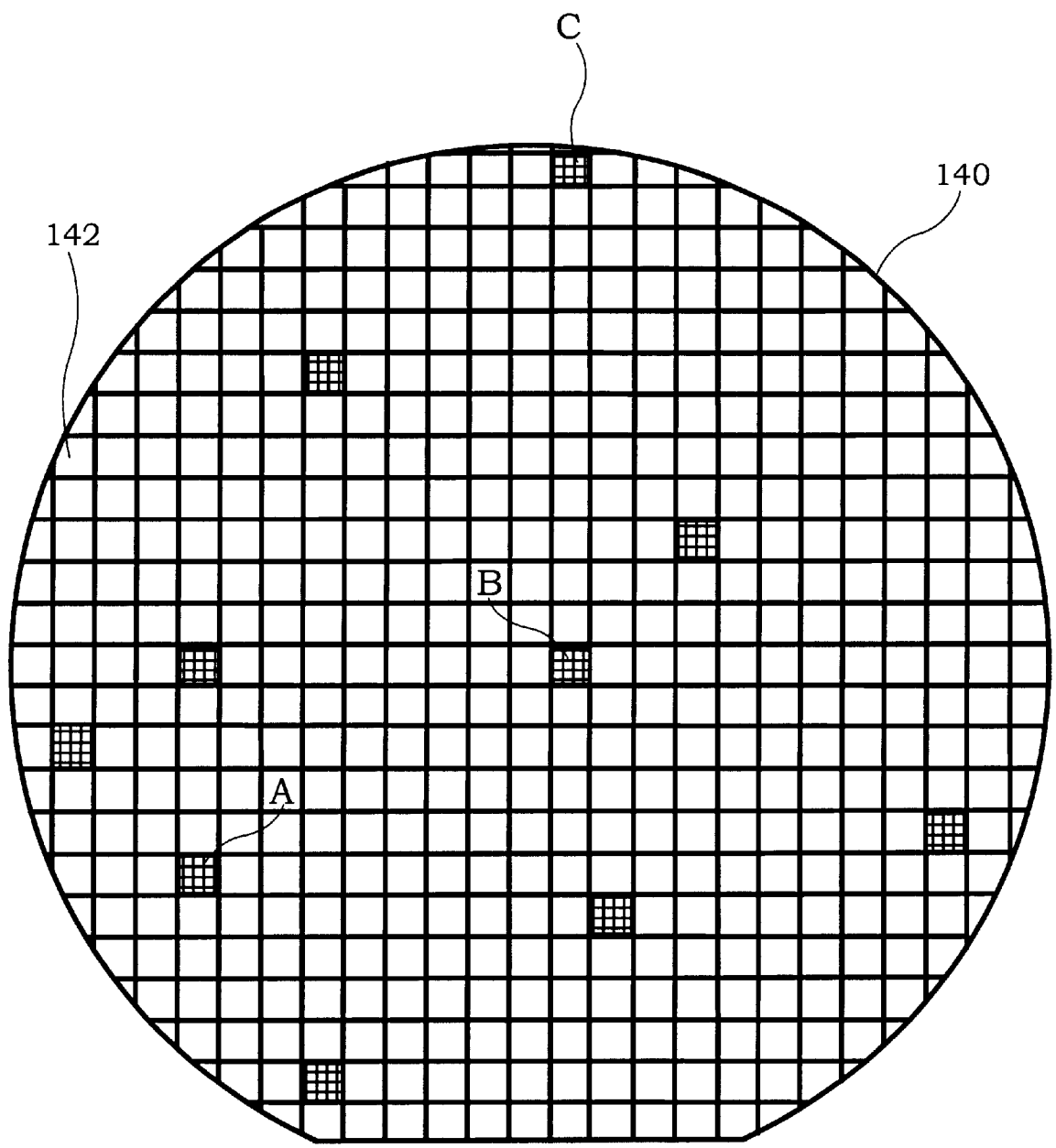
FIG. 4A illustrates a patterned semiconductor wafer.

FIG. 4A illustrates a patterned semiconductor wafer 140. The patterned semiconductor wafer 140 may be at any stage of the fabrication process. The surface of the wafer 140 is divided into a plurality of small squares representing the dies 142 on the surface of the wafer 140. As described above, each of the dies 142 includes a plurality of semiconductor structures that are fabricated, or are in the process of being fabricated, on the wafer 140. In accordance with an embodiment of the present invention, representative dies "A", "B", and "C" are identified to be analyzed to evaluate a selected drying technique following a wet clean.

Figure 4B:
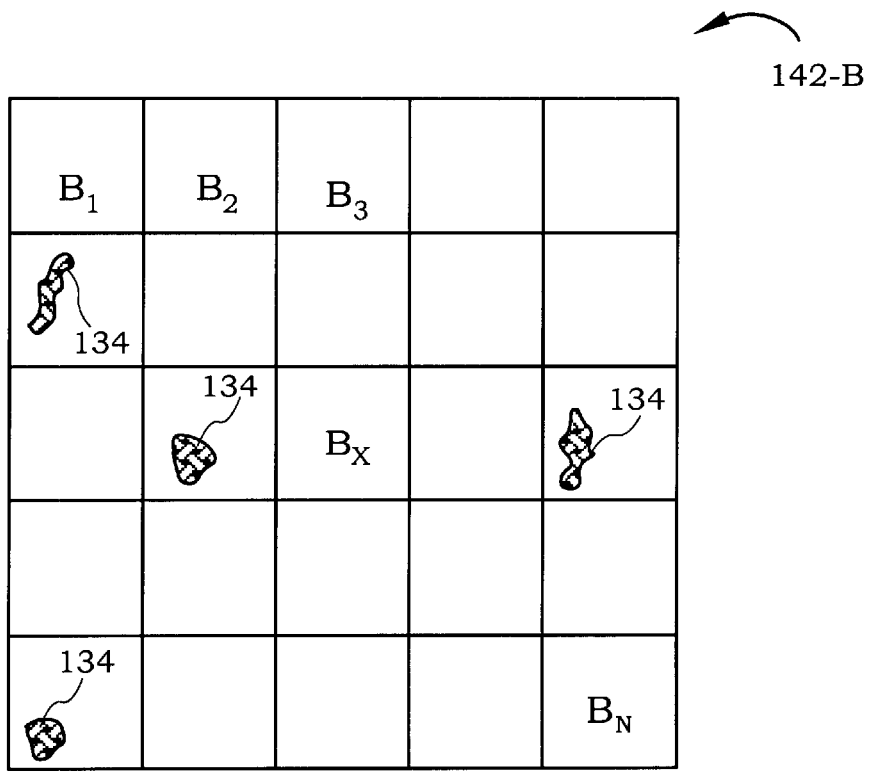
FIG. 4B shows a selected die from the patterned wafer of FIG. 4A in accordance with one embodiment of the present invention.

Looking closer at selected die "B", FIG. 4B shows the selected die 142-B from the patterned wafer of FIG. 4A in accordance with one embodiment of the present invention. As described above, each die 142 includes a plurality of semiconductor structures. The plurality of semiconductor structures can be grouped, by way of example, into like structures, or into combinations of structures performing a common function. A selected die 142-B can be further subdivided into a plurality of regions as illustrated in FIG. 4B and designated $B_1$, $B_2$, $B_3$, . . . , $B_X$, . . . , $B_N$. Some of the plurality of regions contain complex and densely fabricated semiconductor structures, and some of the plurality of regions contain less complex and less densely fabricated semiconductor structures. In one embodiment of the invention, a meaningful evaluation of a drying technique would include an analysis of all ranges of complexity and density of structure and feature fabricated on a semiconductor wafer 142 (FIG. 4A). Compound residue 134 is shown on selected die 142-B.

Figure 4C:
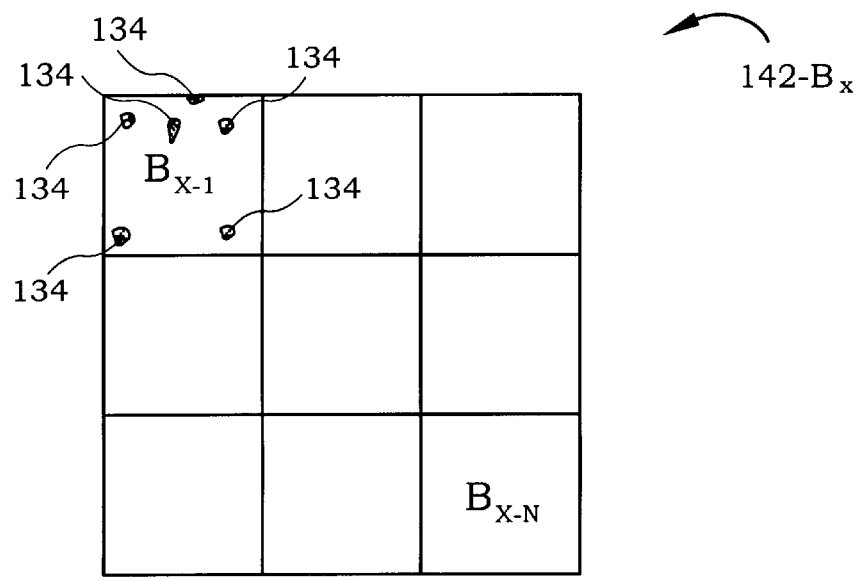
FIG. 4C shows a further subdivision of the selected die shown in FIG. 4B.

FIG. 4C shows a further subdivision 142-$B_X$ of the selected die 142-B shown in FIG. 4B. Depending on the complexity and density of the semiconductor structures fabricated in a selected die 142-B, a plurality of subdivisions 142-$B_x$ may be identified in order to analyze individual features, combinations of features, and entire structures. By way of example, specific geometries of structures or features, or specific locations on a die 142 (FIG. 4A), 142-B (FIG. 4B), may exhibit a tendency to retain solution and resulting compound residue 134. Semiconductor wafers are typically fabricated in large volumes, and particular drying techniques can thereby be identified as most effective for specific wafer fabrication patterns.

The presence of compound residue 134 reveals that water was not completely removed, mechanically, during the drying process. In optimizing the selected drying technique, a number of variables can be adjusted and modified. Examples of variables include the speed of drying, the presence and/or volume of nitrogen blow, whether or not nitrogen blow is heated, the flow of IPA in Marangoni systems, and the like. The method of the present invention, in one embodiment, can be used to optimize a selected drying technique, and such variables can be modified, combined, or otherwise adjusted to achieve the optimum drying technique for specific wafer materials and patterns.

A preferred embodiment of the present invention is implemented in the research and development (R&D) stage of semiconductor fabrication. Typically, large volumes of identical semiconductor structures are mass produced for the most efficient use of tools, materials, and other resources. In one embodiment of the present invention, the drying technique to be used for a particular production wafer is determined and evaluated in the ramp up to production. With data developed during the R&D of the particular semiconductor structure and production wafer, the implementation of the drying techniques employed during various stages of fabrication is readily determinable, and subject to verification to maximize efficiency of production. In one embodiment of the invention, a plurality of drying techniques are evaluated and rated in accordance with the type of structure, stage of fabrication, complexity, density, and other process variables to determine optimum drying techniques for specific applications.

An alternative embodiment of the present invention uses a mixture of polystyrene latex (PSL) spheres and DIW instead of a compound in solution with DIW. PSL spheres are perfectly spherical and have the same known size between $0.08\mu$ and $3.0\mu$ in diameter. PSL spheres are relatively easy to manufacture, and are a well accepted standard in the industry. A mixture of PSL spheres and DIW provides small particles over the surface of the substrate readily detectable with an inspection tool. An example of an inspection tool is an AIT tool manufactured by KLA-Tencor of Santa Clara, Calif. In one embodiment, the PSL spheres are about $0.2\mu$ in diameter, and in a similar manner as the inspection of a solid residue of a compound as described in detail above, the PSL spheres remain on the surface of the substrate where any DIW was not completely removed during the drying process. After the substrate is dried, the substrate is inspected with, for example, an AIT tool, and if any PSL spheres are detected, the frequency, concentration, location on the substrate, and other data is analyzed and evaluated to optimize the drying technique for the particular substrate at a particular stage of fabrication.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for analyzing the effectiveness of a substrate drying operation, comprising:

applying a fluid solution including an analytically detectable compound to a surface of a substrate having features defined therein;

spinning the substrate so that the fluid solution is removed from the substrate, the removing of the fluid solution being configured to leave a residue of the analytically detectable compound on and around the features in areas where the spinning of the substrate failed to completely remove the solution from the surface of the substrate during the spinning; and inspecting the substrate, the inspecting being designed to identify any of the residue, the identified residue defining those areas where the substrate drying operation failed to adequately remove the solution from the surface of the substrate.

2. A method for analyzing the effectiveness of a substrate drying operation as recited in claim 1, wherein the fluid solution contains the analytically detectable compound and deionized water.

3. A method for analyzing the effectiveness of a substrate drying operation as recited in claim 2, wherein the leaving of the residue occurs when the deionized water evaporates where the spinning of the substrate failed to completely remove the solution from the surface of the substrate during the spinning.

4. A method for analyzing the effectiveness of a substrate drying operation as recited in claim 1, wherein the analytically detectable compound is detectable by one of fluorescence spectroscopy, Raman spectroscopy, and luminescence spectroscopy.

5. A method for analyzing the effectiveness of a substrate drying operation as recited in claim 1, wherein a flow rate in applying the fluid solution is between about 100 milliliters per minute and about 1000 milliliters per minute.

6. A method for analyzing the effectiveness of a substrate drying operation as recited in claim 1, wherein a period of exposure of the fluid solution including the analytically detectable compound to the surface of the substrate is between about 1 second and about 5 minutes.

7. A method for analyzing the effectiveness of a wafer drying operation, comprising:

applying a fluid solution including an analytically detectable compound to a surface of a wafer having features defined therein, the features defining portions of semiconductor devices;

spinning the wafer so that the fluid solution is removed from the wafer, the removal of the fluid solution being configured to leave a residue of the analytically detectable compound on and around the features in areas where the spinning of the wafer failed to completely remove the solution from the surface of the wafer during the spinning; and optically inspecting the wafer, the inspecting being designed to identify any of the residue, the identified residue defining those areas where the wafer drying operation failed to adequately remove the solution from the surface of the wafer.

8. A method for analyzing the effectiveness of a wafer drying operation as recited in claim 7, wherein the optically inspecting includes one of spectroscopic inspection, fluorescent inspection, Raman inspection and laser scattering inspection.

9. A method for analyzing the effectiveness of a wafer drying operation, as recited in claim 7, further comprising applying nitrogen gas along with the spinning of the wafer to remove the fluid solution from the surface of the wafer.

10. A method for analyzing the effectiveness of a wafer drying operation as recited in claim 7, wherein the analytically detectable compound includes one of laser dye, organic material producing fluorescence under external excitation, and inorganic material producing fluorescence under external excitation.

11. A method for evaluating substrate drying techniques, comprising:

providing a substrate;

applying an analytically detectable compound in solution to a first surface of the substrate;

drying the substrate with the analytically detectable compound in solution on the first surface of the substrate; and analyzing the first surface of the substrate to detect residue of the analytically detectable compound remaining on the substrate.

12. A method for evaluating substrate drying techniques as recited in claim 11, wherein the first surface of the substrate includes features, the features being structures of semiconductor devices being fabricated on the substrate.

13. A method for evaluating substrate drying techniques as recited in claim 12, wherein the analytically detectable compound in solution flows on and around the features.

14. A method for evaluating substrate drying techniques as recited in claim 11, wherein the analytically detectable compound in solution contains the analytically detectable compound and deionized water.

15. A method for evaluating substrate drying techniques as recited in claim 14, wherein the drying the substrate with the analytically detectable compound in solution on the first surface of the substrate includes one of mechanical spinning, Marangoni-type drying, and drying by replacement of deionized water with another volatile compound.

16. A method for evaluating substrate drying techniques as recited in claim 11, wherein the residue of the analytically detectable compound is obtained when a portion of the analytically detectable compound in solution remains on the first surface of the substrate after the substrate has been dried and a deionized water part of the solution evaporates.

17. A method for evaluating substrate drying techniques as recited in claim 11, wherein a flow rate for the applying the analytically detectable compound in solution to the first surface of the substrate is between about 100 milliliters per minutes and about 1000 milliliters per minute.

18. A method for evaluating substrate drying techniques as recited in claim 11, wherein a period of exposure of the analytically detectable compound in solution to the first surface of the substrate is between about 1 second and about 5 minutes.

19. A method for evaluating substrate drying techniques as recited in claim 14, wherein the analytically detectable compound is laser dye and a concentration of the analytically detectable compound in the deionized water is between about $10^{-6}$ grams per liter and about $10^{-2}$ grams per liter.

20. A method for rating the effectiveness of a wafer drying operation, comprising:

(a) applyin g a fluid solution including an analytically detectable compound to a surface of a wafer having features defined therein, the features defining portions of semiconductor devices;

(b) spinning the wafer so that the fluid solution dries, the drying of the fluid solution being configured to leave a residue of the analytically detectable compound on and around the features in areas where the spinning of the wafer failed to completely remove the solution from the surface of the wafer during the spinning;

(c) inspecting the wafer, the inspecting being designed to identify any of the residue, the identified residue defining those areas where the wafer drying operation failed to adequately remove the solution from the surface of the wafer;

(d) modifying the wafer drying operation, the modifying being designed to improve drying; and (e) repeating (a)–(d) until an optimum drying performance is obtained for a specific wafer having predetermined geometric feature distributions.

21. A method for rating the effectiveness of a wafer drying operation as recited in claim 20, wherein the inspecting includes one of spectroscopic inspection, fluorescent inspection, Raman inspection, and laser scattering inspection.

22. A method for rating the effectiveness of a wafer drying operation as recited in claim 20, wherein the analytically detectable compound includes one of laser dye, organic material producing fluorescence under external excitation, and inorganic material producing fluorescence under external excitation.

23. A method for determining the effectiveness of a wafer drying operation, comprising:

(a) applying a fluid solution including an analytically detectable compound to a surface of a wafer having features defined therein, the features defining portions of semiconductor devices;

(b) spinning the wafer so that the fluid solution removed, the removing of the fluid solution being configured to leave a residue of the analytically detectable compound on and around the features in areas where the spinning of the wafer failed to completely remove the solution from the surface of the wafer during the spinning;

(c) inspecting the wafer, the inspecting being designed to identify any of the residue, the identified residue defining those areas where the wafer drying operation failed to adequately remove the solution from the surface of the wafer;

(d) modifying the wafer drying operation, the modifying being designed to improve drying;

(e) repeating (a)–(d) until an optimum drying performance is obtained for a specific wafer having predetermined geometric feature distributions; and (f) implementing the obtained optimum drying performance in production wafer drying.

24. A method for determining the effectiveness of a wafer drying operation as recited in claim 23, wherein the obtained optimum drying performance is specific to a particular stage of fabrication.

25. A method for determining the effectiveness of a wafer drying operation as recited in claim 24, further comprising:

repeating (a)–(d) until an optimum drying performance is obtained for a specific stage of fabrication having a wet clean procedure; and repeating (a)–(d) for each wet clean procedure required for fabrication of a specific wafer.

* * * * *